United States Patent
Song et al.

(10) Patent No.: US 9,722,564 B2
(45) Date of Patent: Aug. 1, 2017

(54) RECONFIGURABLE ELECTROMAGNETIC INTERFERENCE FILTER NETWORK

(71) Applicant: THE BOEING COMPANY, Chicago, IL (US)

(72) Inventors: Yujie Song, Renton, WA (US); Shengyi Liu, Sammamish, WA (US); Eugene Solodovnik, Lake Stevens, WA (US); Kamiar J. Karimi, Kirkland, WA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 14/703,281

(22) Filed: May 4, 2015

(65) Prior Publication Data

US 2016/0329875 A1    Nov. 10, 2016

(51) Int. Cl.
*H04B 3/04* (2006.01)
*H03H 7/01* (2006.01)
*H03H 1/00* (2006.01)
*H03H 7/075* (2006.01)

(52) U.S. Cl.
CPC ........ *H03H 7/0138* (2013.01); *H03H 1/0007* (2013.01); *H03H 7/0153* (2013.01); *H03H 7/075* (2013.01)

(58) Field of Classification Search
CPC .. H03H 7/0138; H03H 1/0007; H03H 7/0153; H03H 7/075
USPC ....................................................... 333/17.1
See application file for complete search history.

(56) References Cited

U.S. PATENT DOCUMENTS

| | | | | |
|---|---|---|---|---|
| 8,576,022 B2 * | 11/2013 | Chikando | ............ | H03H 7/0153 333/17.1 |
| 2005/0128215 A1 | 6/2005 | Hwang | | |
| 2006/0232358 A1 | 10/2006 | Jedeloo | | |

OTHER PUBLICATIONS

Extended European Search Report for EP16167910, Jan. 10, 2017.

* cited by examiner

*Primary Examiner* — Robert Pascal
*Assistant Examiner* — Kimberly Glenn
(74) *Attorney, Agent, or Firm* — Patterson + Sheridan, LLP

(57) ABSTRACT

An EMI filter network may be used to provide interference filtering for multiple loads (referred to collectively as a dynamic load). In one aspect, the EMI filter network includes electrical switches that establish different configurations or arrangements of passive circuit elements (e.g., inductors and capacitors) where each configuration generates a different filter value. The EMI filter network may be communicatively coupled to a controller which changes the configuration of the EMI filter network using the switches in response to the dynamic load changing operational states. For example, each configuration of the EMI filter network may correspond to one of the operational states of the dynamic load. Thus, as the operational state of the dynamic load changes—e.g., different motors become operational— the controller alters the configuration of the EMI filter network to provide a filter value that corresponds to the current operational state of the dynamic load.

17 Claims, 7 Drawing Sheets

| OPERATIONAL STATE OF DYNAMIC LOAD | CONFIGURATION OF EMI FILTER NETWORK |
|---|---|
| OPERATIONAL STATE 1 (LOAD 135A) | L1, L2, C1, Sw1 = P1, Sw2 = P1, Sw5 = P1 |
| OPERATIONAL STATE 2 (LOAD 135B) | L3, L4, C2, Sw3 = P2, Sw4 = P1, Sw6 = P1 |
| OPERATIONAL STATE 3 (LOAD 135C) | L1, L2, L3, L4, C1, C2, Sw1 = P2, Sw2 = P2, Sw3 = P1, Sw4 = P2, Sw5 = P2, Sw6 = P2 |
| OPERATIONAL STATE 4 (LOAD 135A & B) | L1, L2, C1, Sw1 =P1, Sw2 = P1, Sw5 = P1; and L3, L4, C2, Sw3 = P2, Sw4 = P1, Sw6 = P1 |

RECONFIGURABLE ELECTROMAGNETIC INTERFERENCE FILTER NETWORK

FIELD

Aspects described herein relate to electromagnetic interference (EMI) filters, and more specifically, to an EMI filter network coupled to a dynamic load.

SUMMARY

According to various aspects, a method for electromagnetic interference (EMI) filtering. The method includes configuring an EMI filter network to provide a first filter value to a dynamic load defined by a plurality of loads coupled to the EMI filter network, where the EMI filter network comprises a plurality of switches, and where configuring the EMI filter network comprises selecting respective settings of the plurality of switches. Upon detecting a change in an operational state of the dynamic load, the method includes reconfiguring the EMI filter network to provide a second filter value to the dynamic load by changing the settings of at least one of the plurality of switches.

According to various aspects, an EMI filter network that includes a plurality of passive circuit elements, a plurality of switches, and first and second outputs configured to couple to respective loads. The plurality of switches are disposed between the plurality of passive circuit elements such that, upon changing a state of at least one of the switches, the plurality of passive circuit elements are reconfigured from a first configuration that provides a first filter value for the first output to a second configuration that provides a second filter value for the second output.

According to various aspects, a system that includes an EMI filter network comprising a plurality of switches, a dynamic load defined by a plurality of loads coupled to the EMI filter network, and a controller. The controller is configured to configure the EMI filter network to provide a first filter value to the dynamic load, where configuring the EMI filter network comprises selecting respective settings of the plurality of switches. Upon detecting a change in an operational state of the dynamic load, the controller is configured to reconfigure the EMI filter network to provide a second filter value to the dynamic load by changing the settings of at least one of the plurality of switches.

According to various aspects, a method is used to design an EMI filter network. The method includes determining individual EMI filters for each of a plurality of loads and determining a total number of passive circuit elements in the individual EMI filters. The method includes generating a respective configuration table for each of the loads, wherein each configuration table includes a list of possible configurations for EMI filters for each of the loads using a first number of passive circuit elements that is less than the total number of passive circuit elements and identifying, using a searching application, at least one configuration for each of the loads and appropriate values for the first number of passive circuit elements. The method includes generating the EMI filter network based on the identified configurations and appropriate values.

BRIEF DESCRIPTION OF THE SEVERAL VIEWS OF THE DRAWINGS

To facilitate understanding, identical reference numerals have been used, where possible, to designate identical elements that are common to the figures. It is contemplated that elements disclosed in one aspect may be beneficially utilized on other aspects without specific recitation.

Each figure shown in this disclosure shows a variation of an aspect of the embodiments presented, and only differences will be discussed in detail.

DETAILED DESCRIPTION

EMI filters may be placed in electronic circuits to mitigate the effects of electromagnetic induction or electromagnetic radiation. If left unfiltered, this interference may interrupt, obstruct, or degrade the effective performance of the circuit. In one aspect, EMI filters may be used to filter power signals used to drive loads (e.g., motors or actuators) to remove unwanted electronic signals. However, the components of an EMI filter (e.g., capacitors and inductors) increase the weight of a motor controller which may contain the filter. For example, the EMI filter may contribute up to 60% of the motor controller's total weight. For some high-power systems, the EMI filter may add up to 20-50 kilograms to the weight of the motor controller. Moreover, the EMI filters may require a significant amount of space. In many scenarios, the weight and volume associated with the EMI filters may affect the function of the system in which they are installed. For example, when installed in an airplane, EMI filters may take up space that could otherwise be used for cargo and reduce the fuel efficiency by adding additional weight.

In one aspect, instead of installing individual EMI filters for each motor or actuator, an EMI filter network may be used to provide interference filtering for multiple loads (referred to collectively as a dynamic load). The EMI filter network may include fewer electrical components than would be used if individual EMI filters were installed for each of the loads, thereby reducing the weight and the space required to provide interference filtering for the dynamic load. In one aspect, the EMI filter network includes electrical switches that establish different configurations or arrangements of passive circuit elements (e.g., inductors and capacitors). Each of the configurations generates a different filter value. The EMI filter network may be communicatively coupled to a controller which changes the configuration of the EMI filter network in response to the dynamic load changing operational states. For example, each configuration of the EMI filter network may correspond to one of the operational states of the dynamic load. Thus, as the operational state of the dynamic load changes—e.g., different motors (or combinations of motors) become operational—the controller alters the configuration of the EMI filter network to provide a filter value (or values) that corresponds to the current operational state of the dynamic load. In this manner, a single EMI filter network can be switchable configured to respond to changes in a dynamic load which includes a plurality of separate loads.

Figure 1:
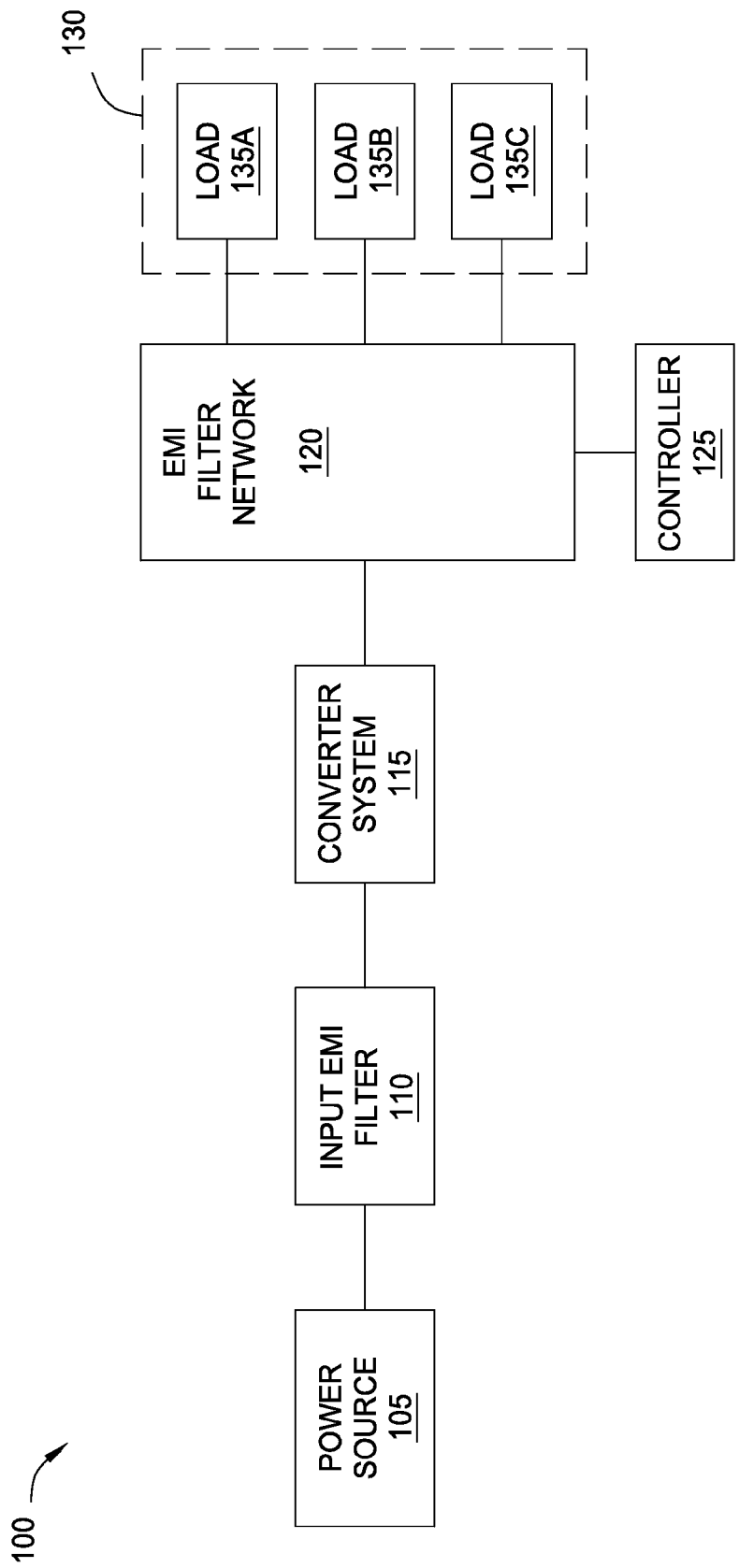
FIG. 1 is a block diagram illustrating an EMI filter network coupled to a dynamic load.

FIG. 1 is a block diagram illustrating an EMI filter network 120 coupled to a dynamic load 130. In one aspect, system 100 may be installed in a moveable vehicle such as a train, airplane, ship, and the like. In another aspect, system 100 may be installed in a fixed facility. As shown, system 100 includes power source 105, input EMI filter 110, power converter system 115, EMI filter network 120, controller 125, and dynamic load 130.

The power source 105 (e.g., an external power source) may be a DC or AC power source that provides power along a power bus to EMI filter 110. In one aspect, the power source 105 generates power using energy provided by an engine (not shown)—e.g., a jet engine, combustion engine, etc. The input EMI filter 110 removes unwanted interference from the power provided by the power source 105 before transmitting the power to the power converter system 115 which converts the power generated by the power source 105 into a power usable by loads 135 in the dynamic load 130 (e.g., motors or actuators). In one example, the power source 105 may provide DC power but the loads 135 require AC power to operate, in which case the power converter system 115 performs an DC to AC conversion. The opposite may be true where the power source 105 outputs AC power which is then converted by the power converter system 115 into DC power for the loads 135. Alternatively, the power source 105 may provide power that matches the power type required by the loads 135—e.g., both source 105 and dynamic load 130 are compatible with AC power. However, the loads 135 may have different voltage or current requirements than the power outputted by the power source 105. For example, the power source 105 may output a 1000V and 0.5 amps DC power signal but the loads 135 need a 220V and 2 amp power signal. In that case, the power converter system 115 may include one or more transformers that convert the DC power into suitable voltage and current ranges. However, if the power source 105 generates power that is compatible with the loads 135 without having to perform an AC/DC conversion or change the voltage/current characteristics, then the system 100 may not need the power converter system 115 and input EMI filter 110.

In one aspect, the loads 135 have variable power needs where the voltage and frequency of the delivered power changes depending on one or more operating conditions of the loads 135 (e.g., output speed, torque, changing flows or pressure, etc.). For example, the power source 105 may adjust the voltage and/or frequency of the delivered power in order to satisfy the dynamic power demands of the loads 135. Furthermore, if the power source 105 changes the voltage or frequency to satisfy the power demand for one of the loads 135, the power converter system 115 and controller 125 may work in tandem to ensure the correct power is still delivered to the other loads 135—i.e., the loads 135 may have different power demands.

As illustrated, the output of the power converter system 115 couples to the EMI filter network 120, which is in turn coupled to multiple loads 135. The EMI filter network 120 may include multiple switches that enable the network 120 to be reconfigured. In one aspect, the switches in the filter network 120 form electrical connections between different discrete passive electrical components (e.g., inductors and capacitors). By changing the switches, different electrical connections can be made between the electrical components thereby changing the filter value (or values) generated by the EMI filter network 120 which are used to filter received power. In one aspect, the different configurations of the EMI filter network 120 correspond to respective operational states of the dynamic load 130. For example, in one operational state, only load 135A may be operational while the other loads 135B and 135C are non-operational. Thus, the EMI filter network 120 need only provide a filter value suitable for load 135A. A controller 125 may determine the operational state of the dynamic load 130 and send control signals to the switches in the EMI filter network 120 to provide the filter value corresponding to the current operational state. Continuing the example above, the controller 125 may alter the switches to disconnect some of the electrical components and connect others so that the correct filter value is provided to load 135A. If controller 125 changes the operational state (e.g., both loads 135A and 135B are operational), the controller 125 reconfigures the electrical components in the EMI filter network 120 so that the correct filter values are provided to the dynamic load 130.

In one aspect, the controller 125 receives data packets or sensor data indicating the operational state of the dynamic load 130—i.e., which of the loads 135 are operational and which are non-operational. Alternatively, the controller 125 may be responsible for controlling and changing the operational state of the loads 135, and thus, knows the operational state of the dynamic load 130. In one aspect, the controller 125 may be a software application executing on a computing system, a hardware component, or a combination of both. Further, although shown as being separate from the EMI filter network 120, in another aspect the controller 125 may be integrated with the network 120. In one example, the EMI filter network 120 and controller 125 may both be located within a motor controller that controls the loads 135.

The loads 135 may have different functions. For example, load 135A may be a motor that drives a fan for circulating air in a vehicle, while load 135B may be a cooler that provides refrigeration for the cargo and load 135C is a motor for powering a hydraulic system. Moreover, the loads 135 may each draw different power from converter system 115. For example, loads 135A and 135B may draw 10 kilowatts of power while load 135C draws 400 kilowatts of power. Moreover, the loads 135 may be disposed at different locations in system 100 or may be located in the same location (e.g., are contained in the same chassis). Regardless, the EMI filter network 120 is disposed in the system 100 so that it is coupled to each of the loads 135 in order to provide filtered power to the loads 135.

Figure 2:
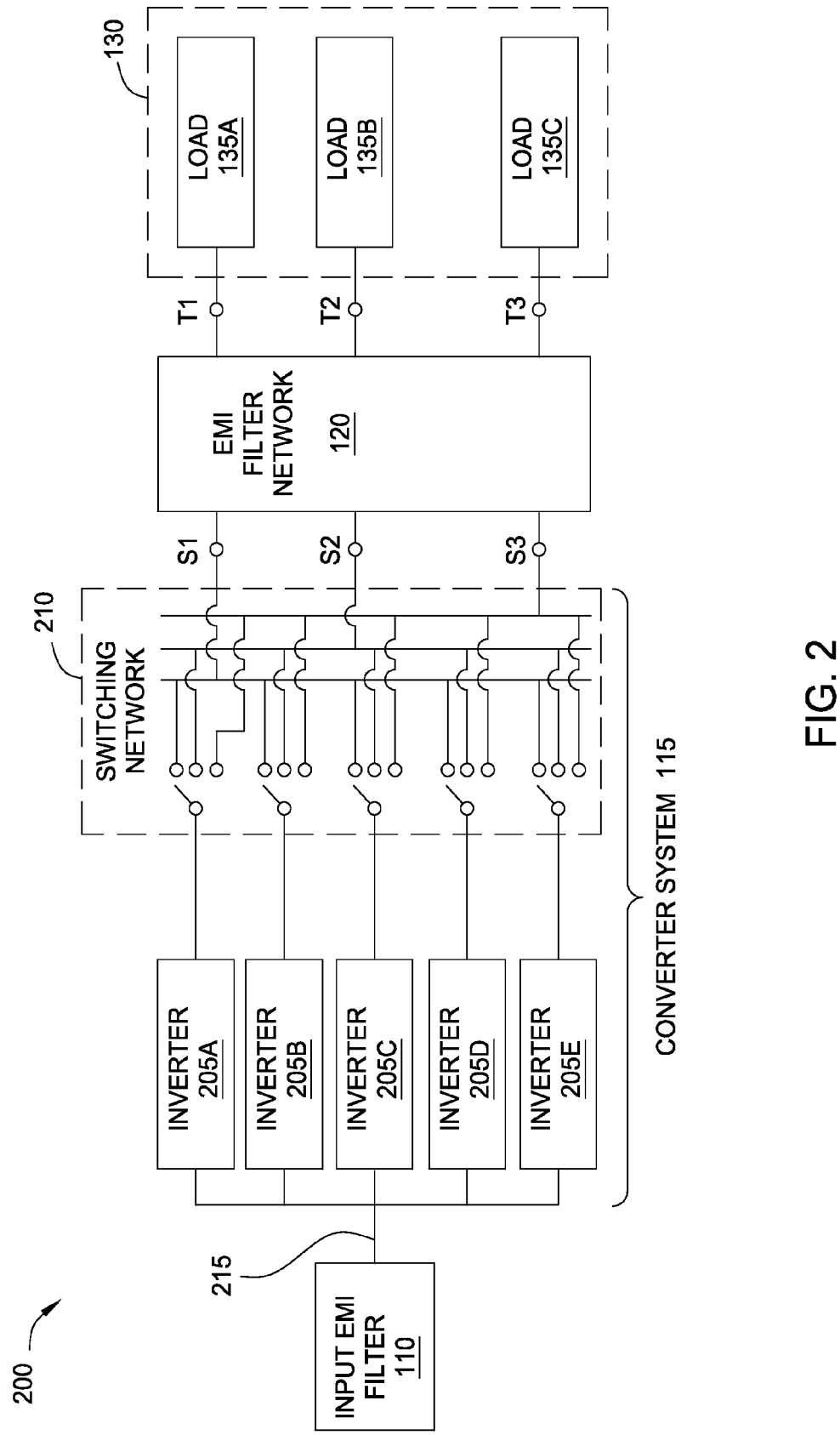
FIG. 2 is a block diagram illustrating an EMI filter network coupled to a dynamic load.

FIG. 2 is a block diagram illustrating the EMI filter network 120 coupled to the dynamic load 130. As shown, system 200 illustrates converter system 115 in more detail than in FIG. 1. Here, converter system 115 includes multiple inverters 205 coupled to a switching network 210 for converting a DC power signal to an AC signal. The input EMI filter 110 uses a DC bus 215 to provide the positive and negative voltages to each of the inverters 205. The inverters 205 and switching network may use a control signal (e.g., a pulse width modulation signal) to switch the DC power signal and generate AC signals (for example, sinusoidal waveforms) at the outputs S1, S2, and S3. In one aspect, each of the outputs S1, S2, and S3 may correspond to a three-phase AC signal. For example, each output may drive a three-phase motor as load. In another aspect, each of the outputs S1, S2, and S3 may correspond to one phase AC signal (for example, each output drives a single phase load). Because a three-phase AC signal is symmetric except for the 120 degree phase difference, EMI filter design uses one phase for calculation and then duplicates the resulting filter three times for the three phases. For simplicity, in this disclosure, EMI filter design is shown for one phase which then can be used for multiple phase systems.

The EMI filter network 120 may be used to smooth the AC signal generated by the converter system 115 and remove electromagnetic radiation interference signals. For example, the EMI filter network 120 may remove high-frequency components from the AC signal (e.g., a square wave) to generate lower frequency sine waves. As discussed above, a controller (not shown) may reconfigure the EMI filter network 120 in response to the dynamic load 130 changing operational states.

Figures 3, 4:
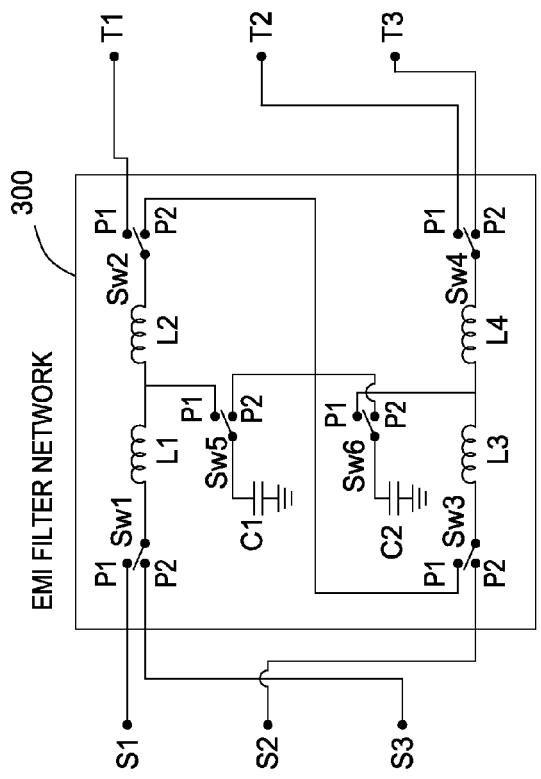
FIG. 3 is circuit diagram of a EMI filter network.
FIG. 4 is a chart illustrating different configurations of the EMI filter network corresponding to different operational states of the dynamic load.

FIG. 3 is circuit diagram of an EMI filter network 300 according to one aspect described herein. The outputs S1, S2, and S3 of the converter system 115 serve as inputs for the network 300. The EMI filter network 300 includes multiple switches (e.g., Sw1, Sw2, Sw3, Sw4, Sw5, and Sw6) which determine how the electrical components (e.g., the inductors (L) and capacitors (C)) are interconnected. Although not shown, a controller (e.g., controller 125) provides control signals for determining the setting of the switches. That is, the controller may determine whether Sw1 should be connected to P1 or P2. For example, when Sw1 is connected to P1, the inductor L1 is coupled to S1, but when Sw1 is connected to P2, L1 is coupled to S2. Similarly, the switches may change the electrical paths within the EMI filter network 300. For example, if Sw5 is coupled to P1, then the capacitor C1 is electrically coupled to both L1 and L2. However, if Sw5 is coupled to P2, then C1 is coupled to C2 (assuming Sw6 is connected to P2 instead of P1). Thus, by controlling the switches, the configuration of the EMI filter network 120 can be altered, thereby changing the filter values seen at the outputs T1, T2, and T3. Stated differently, in response to the operational state of the dynamic load changing, the controller may alter the switches in the EMI filer network 300 such that the LC filter value changes on at least one of the outputs T1, T2, and T3.

FIG. 4 is a chart 400 illustrating different configurations of the EMI filter network corresponding to different operational states of the dynamic load. Specifically, chart 400 provides the settings of the switches that provide the desired filter values at the outputs T1, T2, and T3 for the various operational states of the dynamic load. In this example, the dynamic load has four operational states. In operational state 1, only load 135A is operational. In operational state 2, only load 135B is operational. In operational state 3, only load 135C is operational. And in operational state 4, both loads 135A and 135B are operational. Of course, in other examples, different operational states may be possible (e.g., all three loads 135 may be operational). The number of operational states depends on the particular structure and functionality of the dynamic load.

For each of the operational states, chart 400 includes a corresponding configuration of the EMI filter network 300. As shown, these configurations indicate the correct settings of the switches such that the desired filter value (i.e., a LC filter value) is provided for at least one of the outputs T1, T2, and T3 of the EMI filter network 300. For operational state 1, the filter value is determined by L1, L2, and C1 which are coupled together by setting Sw1 to connect to P1, Sw2 to P1, and Sw5 to P1. This combination of L1, L2, and C1 provide the desired filter value at output T1 for filtering the power signal transmitted to load 135A. Note that the other electrical components in the EMI filter network 300 (e.g., C2, L3 and L4) may be coupled to the outputs T2 and T3, but because loads 135B and 135C are not operational, these components do not affect the loads. Put differently, so long as C2, L3, and L4 (i.e., the electrical components that are not currently being used) are not electrically coupled to C1, L1, and L2 (i.e., the electrical components that are currently being used), then C2, L3, and L4 can be coupled to an output of the EMI filter network 300 that is attached to a non-operational load. However, in one aspect, the EMI filter network 300 may include additional switches for selectively disconnecting the outputs T1, T2, and T3. For example, when the dynamic load is in operational state 1, the switches at the outputs T2 and T3 may be deactivated, thereby disconnecting the EMI filter network 300 from loads 135B and 135C.

When the dynamic load switches to operational state 2, the EMI filter network 300 may reconfigure the switches such that the proper filter value is provided to load 135B at output T2. Here, the filter value is defined by the combination of L3, L4, and C2 which are interconnected by setting Sw3 to P2, Sw4 to P1, and Sw6 to P1. In the scenario where the dynamic load switches from operational state 1 to operational state 2, the controller may not need to reconfigure the EMI filter network 300. Stated differently, the switches in the EMI filter network 300 may already be in a configuration that provides the correct filter values at both T1 (i.e., load 135A) and T2 (i.e., load 135B). This is possible since the electrical components and switches needed to provide the correct filter value to load 135A (i.e., L1, C2, C1, Sw1, Sw2, and Sw5) are not the same electrical components and switches needed to provide the correct filter value to load 135B (i.e., L3, L4, C2, Sw3, Sw4, and Sw6). However, this is not the case if the dynamic load switches from either operational state 1 or 2 to operational state 3. That is, because the filter value provided to load 135C relies on electrical components and switches that are used when in operational states 1 and 2, the controller must reconfigure the switches and connect the electrical components differently. For example, in operational state 1, L1 is coupled to C1, however in operational state 3, Sw5 is connected to P2 thereby disconnecting L1 from C1. Thus, the output T1 may no longer provide a filter value that is suitable for load 135A, however, this is acceptable since in operational state 3 load 135A is non-operational, and thus, the only filter value that matters is the one provided at output T3 which is coupled to load 135C. In this manner, chart 400 illustrates different configurations of the EMI filter network 300 that correspond to different operational states of the dynamic load where each load may require a different filter value when operational. Designing a reconfigurable EMI filter network 300 to satisfy the different operational states of a dynamic load will be addressed later.

In one aspect, chart 400 may be stored in a data structure in the controller. In response to identify the current operational state of the dynamic load, the controller may index into chart 400 to identify the configuration of the EMI filter network 300 that corresponds to the current operational state. The controller retrieves the switch settings for this configuration and outputs control signals to place the switches in the filter network 300 in the desired configuration, thereby electrically configuring the inductors and capacitors to provide the desired filter value at the appropriate output (or outputs). For example, when in operational state 4, the EMI filter network 300 provides a respective filter value at both outputs T1 and T2 for loads 135A and 135B.

Figure 5:
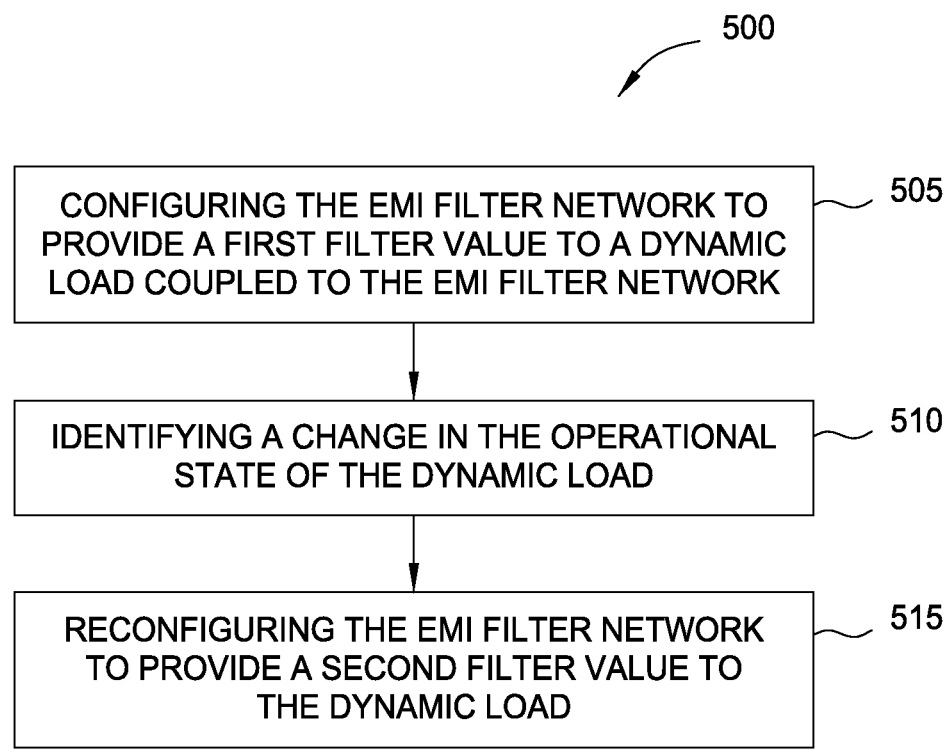
FIG. 5 is a method of reconfiguring the EMI filter network based on changes in the operational state of the dynamic load.

FIG. 5 is a method 500 of reconfiguring the EMI filter network based on changes in the operational state of the dynamic load. At block 505, the controller configures the EMI filter network to provide a first filter value to a dynamic load coupled to the network. In one aspect, the EMI filter network includes respective electrical connections to separate loads in the dynamic load. The dynamic load may include different operational states where, in each state, a different set of the loads in the dynamic load are operational. Note that a "set" may include only one load or multiple loads being operational. If one load is operational, the EMI filter network provides a filter value at the output connected to the operational load that is desired by the load. That is, two or more of the loads in the dynamic load may desire different filter values. Thus, if multiple loads are operational that desire different filter values, then the EMI filter network provides these different values at the respective outputs. For example, one filter value may be a low pass filter set at first frequency while another filter value may be a low pass filter set at a second, different frequency.

At block 510, the controller identifies a change in the operational state of the dynamic load. For example, the controller may receive a message that a different set of the loads in the dynamic load are (or about to become) operational or use sensors to monitor the loads. For example, the controller may measure the power drawn by the separate loads in the dynamic load, a voltage input to the converter system, or the voltage outputted from the EMI filter network to the dynamic load in order to determine the operational state of the dynamic load. Alternatively, the controller may be responsible for controlling and changing the operational states of the loads within the dynamic load, and thus, knows the current state of the dynamic load.

At block 515, the controller reconfigures the EMI filter network to provide a second filter value to the dynamic load. In one aspect, the EMI filter network includes switches that may connect the inductors and/or capacitors in the EMI filter network to each other or different inputs/outputs. By altering the switches, the controller can change or set the filter values seen at the respective outputs of the EMI filter network.

In one aspect, when reconfiguring the EMI filter network at block 515, the filter value at one the outputs changes relative to the previous filter value at the same output. For example, using chart 400 of FIG. 4 as an example, when in operational state 1, the filter value at output T1 is defined by L1, L2, and C2. However, when the dynamic mode changes to operational state 3, Sw2 switches to P2 and disconnects the output T1 from any electrical component in the EMI filter network. Moreover, in operational state 3, the filter value at T3 is defined by the combination of L1, L2, L3, L4, C1 and C2 which is different than the filter value when in operational state 1. For example, when in operational state 1, the Sw4 may have been connected to P1 thereby disconnecting output T3 from any of the electrical components in the EMI filter network. Thus, in these examples, when reconfiguring the EMI filter network, a filter value at an output (or outputs) changes—e.g., the filter value goes from a zero value to a non-zero value. Of course, in other examples, the controller may not need to reconfigure the EMI filter network when the dynamic loads switches between operational states. As discussed above, the configuration of the EMI filter network may not change when the operational state of the dynamic load switches from operational state 1 to state 2 or vice versus.

Figure 6:
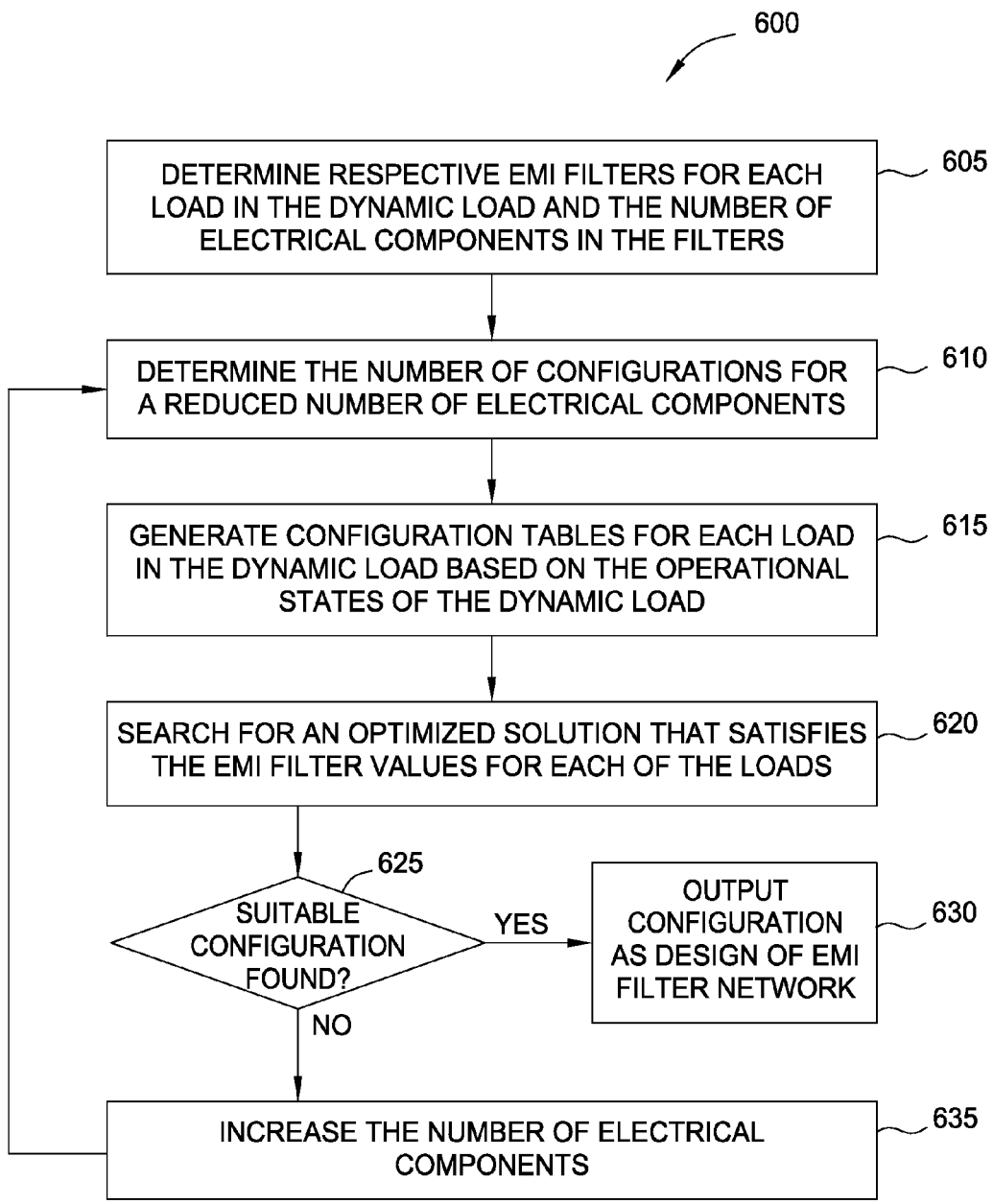
FIG. 6 is a method for designing an EMI filter network.

FIG. 6 is a method 600 for designing an EMI filter network. At block 605, a designer determines respective EMI filters for each load in the dynamic load and the number of electrical components in the filters. Stated differently, instead of designing an EMI filter network where one reconfigurable network can provide EMI filtering for multiple loads, the designer determines an individual EMI filter for each of the loads.

Figure 7:
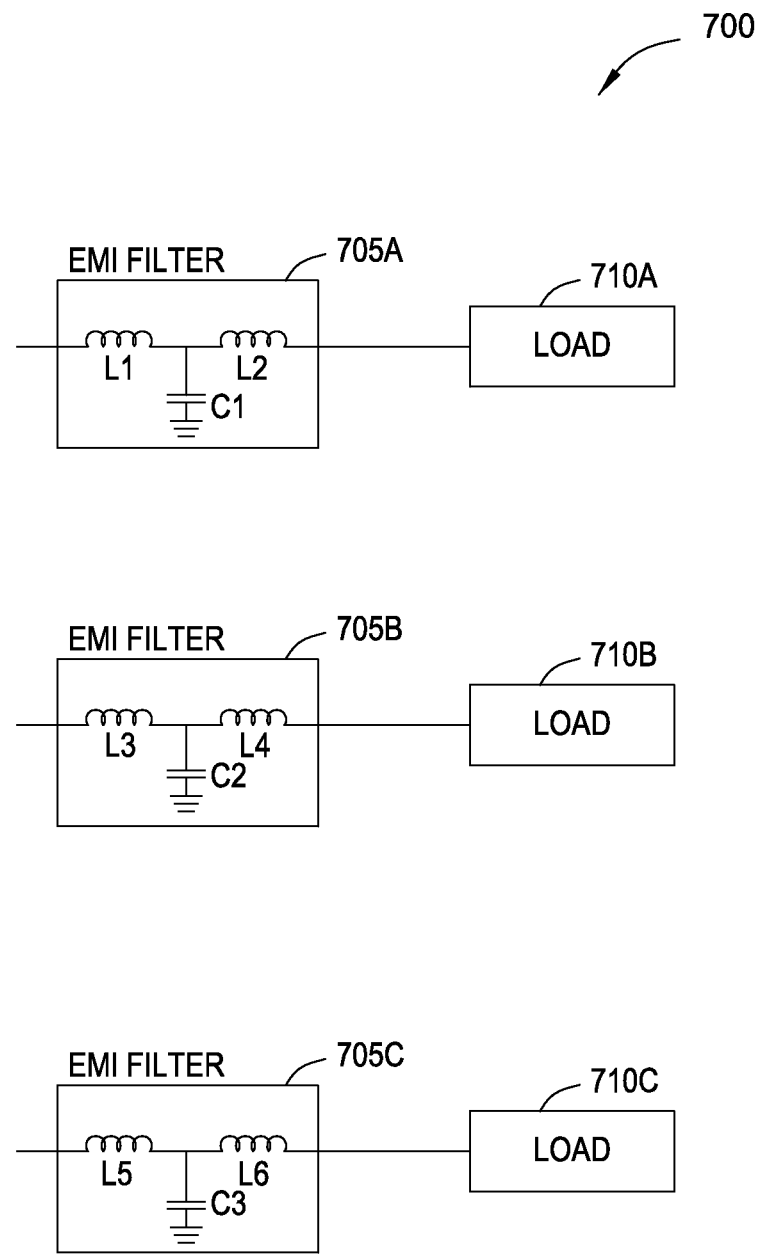
FIG. 7 is a block diagram illustrating individual EMI filters for multiple loads.

FIG. 7 is a block diagram illustrating respective EMI filters 705 for multiple loads 710. For example, the loads 710A, 710B, and 710C may correspond to the loads 135A, 135B, and 135C in dynamic load 130 in FIG. 1. Here, each of the loads 710 may require a different filter value, and as such, each EMI filter 705 may include different inductor and capacitor values in order to provide the appropriate filter value for each load 710. Designing the circuits and assigning appropriate inductor and capacitor values may be performed at block 605 of method 600. In one aspect, the EMI filters 705 are standalone filters that are not reconfigurable.

At block 610 of method 600, the designer determines the number of possible configurations using a reduced number of electrical components relative to the total number of electrical components in the individual EMI filters 705 shown in FIG. 7. Put differently, the designer adds the total components in the EMI filters 705 for the loads 710 to determine a total number of passive circuit elements in the EMI filters 705, which, in this example includes six inductors and three capacitors. At block 610, the designer chooses a number of electrical components that is less than this total. For this discussion, assume the reduced number of electrical components is four inductors and two capacitors—i.e., a reduction of two inductors and one capacitor relative to the total number of components in the EMI filters 705.

In one aspect, to limit the number of switches added to the EMI filter network (which also take up space and add weight), the designer may use a rule where any new EMI filter element will use no more than two individual components. For example, L1 in filter 705A may be created using either one of the four inductors in the reduced number of electrical components or no more than a combination of two inductors, but not a combination that would require three or four of the inductors from the reduced set of electrical components. This rule may help limit the number of switches used to reconfigure the EMI filter network when complete. However, the use of the rule is optional, for example, the weight and volume of the switches may not be a concern.

Figure 8:
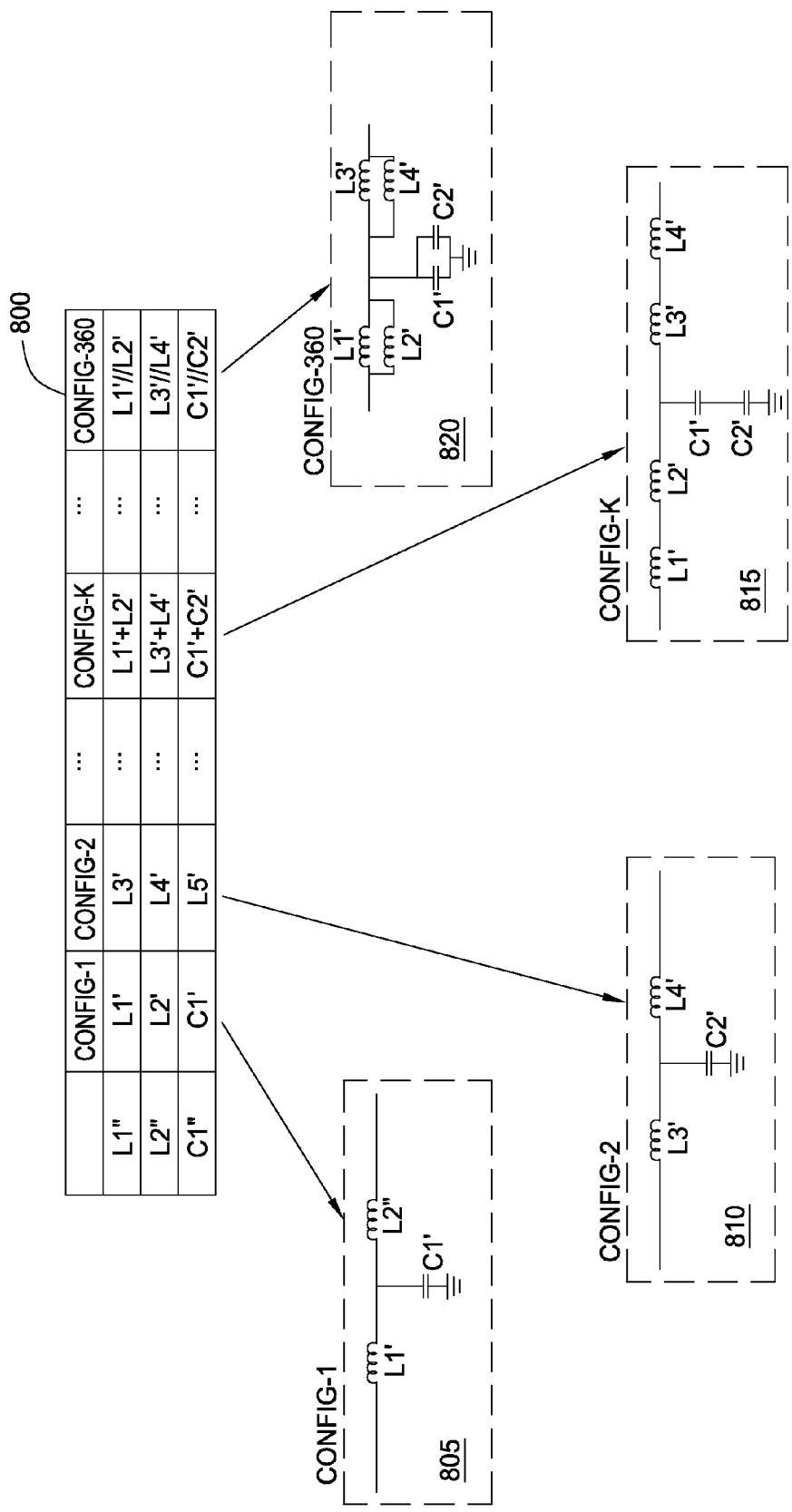
FIG. 8 is a configuration table of EMI filters for a load.

FIG. 8 is a configuration table 800 of EMI filters for a load which illustrates the total number of possible configurations using the reduced number of electrical components. In this example, there are 360 possible configurations of the four inductors and two capacitors. For illustrative purpose, four of these configurations are shown in circuits 805, 810, 815, and 820. At this point in the design process, the inductors and capacitors have not been assigned particular values.

Returning to method 600, at block 615, the designer generates configuration tables for each load in the dynamic load based on the operational states of the dynamic load. To do so, the designer identifies the possible operational states of the dynamic load. For example, using the example shown in chart 400 of FIG. 4, that dynamic load has four operational states. In operational states 1, 2, and 3, only one of the loads 135 is operational. However, in operational state 4, both loads 135A and 135B are operational. Once all the possible operational states for a particular dynamic load are identified, the designer then generates a configuration table for each of the loads.

In one aspect, the configuration table 800 in FIG. 8 is assigned to the load 135A. Because in operational state 4 both loads 135A and 135B are operated simultaneously, the configuration table for load 135B is a subset of the configuration table 800. That is, once all of the necessary inductors and capacitors for providing the filter for load 135A are identified, these components are marked as unusable for designing the filter for load 135B (since those components will be needed for the EMI filter for load 135A). The configuration table for load 135B is then created using the same procedure in block 610 but without using the components assigned to load 135A, and thus, has fewer configurations than table 800.

The configuration table for the third load—i.e., load 135C—may be the same as the configuration table for load 135A since these loads always work independent of each other. That is, the dynamic load will never be in an operational state where both load 135A and load 135C are operational simultaneously. As such, the electrical components that were used to generate the EMI filter for load 135A may also be used to generate the EMI filter for load 135C. Thus, all four of the inductors and the two capacitors can be used when forming the EMI filter thereby resulting in a configuration table with 360 combinations—i.e., the same size as the configuration table 800 for load 135A.

At block 620, the designer searches for an optimized solution that satisfies the EMI filter values for each of the loads. To do so, the designer may use a search application (e.g., a software application) that performs a searching algorithm such as a searching mesh and range. For instance, the searching algorithm may use a defined searching step and boundary conditions—e.g., a maximum number of searches—to identify appropriate values for the four inductors and two capacitors. Once the searching application is configured, sets of values for the inductors and capacitors are then searched to determine suitable values that satisfy the EMI filter values associated with each load. For example, the search algorithm identifies whether there are inductor and capacitor values that can be assigned to at least one configuration for each of loads. If there are multiple suitable configurations of inductor and capacitor values, then the search application or designer may choose the configuration that has the fewest switches or smallest inductor and capacitor values (since smaller values mean the inductors and capacitors can weigh less or take up less volume).

At block 625, if the configurations that are identified at block 620 result in the desired EMI filter values for the loads, then method 600 proceeds to block 630 where the identified configurations are combined to form the design of the EMI filter network. However, if the identified configurations are not suitable, at block 635 the designer increases the number of electrical components. For example, instead of using four inductors and two capacitors, the designer may increase the reduced number of electrical components to five inductors and two capacitors. The method 600 then returns to block 610 to determine if any optimized solution can be found using the increased number of electrical components. Although not shown, method 600 may be continue until either an optimized solution is found (i.e., the method reaches block 630) or until the number of reduced electrical components is the same as the total number of electrical components in the individual EMI filters that was identified at block 605.

The descriptions of the various aspects have been presented for purposes of illustration, but are not intended to be exhaustive or limited to the aspects disclosed. Many modifications and variations will be apparent to those of ordinary skill in the art without departing from the scope and spirit of the described aspects. The terminology used herein was chosen to best explain the principles of the aspects, the practical application or technical improvement over technologies found in the marketplace, or to enable others of ordinary skill in the art to understand the aspects disclosed herein.

In the preceding paragraphs, reference is made to aspects presented in this disclosure. However, the scope of the present disclosure is not limited to specific described aspects. Instead, any combination of the preceding features and elements, whether related to different aspects or not, is contemplated to implement and practice contemplated aspects. Furthermore, although aspects disclosed herein may achieve advantages over other possible solutions or over the prior art, whether or not a particular advantage is achieved by a given aspect is not limiting of the scope of the present disclosure. Thus, the preceding aspects, features, and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects may take the form of an entirely hardware aspect, an entirely software aspect (including firmware, resident software, micro-code, etc.) or an aspect combining software and hardware aspects that may all generally be referred to herein as a "circuit," "module" or "system."

Aspects may be a system, a method, and/or a computer program product. The computer program product may include a computer readable storage medium (or media) having computer readable program instructions thereon for causing a processor comprising hardware and software to carry out aspects described herein.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices comprising hardware and software from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present aspects may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some aspects, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects disclosed herein. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to aspects, other and further aspects may be devised without departing from the basic scope thereof, and the scope thereof is determined by the claims that follow.

What is claimed is:

1. A method for electromagnetic interference (EMI) filtering, the method comprising:
configuring an EMI filter network to provide a first filter value to a dynamic load defined by a plurality of loads coupled to the EMI filter network, wherein the EMI filter network comprises a plurality of switches, and wherein configuring the EMI filter network comprises selecting respective settings of the plurality of switches; and
upon identifying a change in an operational state of the dynamic load, reconfiguring the EMI filter network to provide a second filter value to the dynamic load by changing the settings of at least one of the plurality of switches,
wherein the first filter value corresponds to a first operational state of the dynamic load and the second filter value corresponds to a second operational state of the dynamic load, wherein, in the first operational state, a first set of the plurality of loads are operational, and in the second operational state, a second set of the plurality of loads are operational.

2. The method of claim 1, wherein the EMI filter network comprises a plurality of inductors and a plurality of capacitors, wherein the EMI filter network provides the first filter value by electrically connecting the plurality of inductors and capacitors in a first configuration using the plurality of switches and provides the second filter value by electrically connecting the plurality of inductors and capacitors in a second configuration using the plurality of switches.

3. The method of claim 1, wherein the first set comprises a first load of the plurality of loads that is operational when the dynamic load is in the first operational state, and wherein the first load is non-operational when the dynamic load is in the second operational state.

4. The method of claim 1, wherein the first filter value is provided at a first output of the EMI filter network that connects to a first one of the plurality of loads, and the second filter value is provided at a second output of the EMI filter network that connects to a second one of the plurality of loads.

5. The method of claim 4, wherein, when the EMI filter network provides the first filter value at the first output, the EMI filter network provides a third filter value at the second output, and wherein the third filter value is different from the second filter value.

6. A method for EMI filtering, the method comprising:
configuring an EMI filter network to provide a first filter value to a dynamic load defined by a plurality of loads coupled to the EMI filter network, wherein the EMI filter network comprises a plurality of switches, and wherein configuring the EMI filter network comprises selecting respective settings of the plurality of switches;
upon identifying a change in an operational state of the dynamic load, reconfiguring the EMI filter network to provide a second filter value to the dynamic load by changing the settings of at least one of the plurality of switches, wherein the first filter value is provided at a first output of the EMI filter network that connects to a first one of the plurality of loads, and the second filter value is provided at a second output of the EMI filter network that connects to a second one of the plurality of loads; and
receiving power at one or more inputs of the EMI filter network from a power converter system, wherein the first and second filter values filter a received power before providing a filtered power to the dynamic load using the first and second outputs of the EMI filter network.

7. An EMI filter network, comprising:
a plurality of passive circuit elements;
a plurality of switches;
first and second outputs configured to couple to respective loads; and
at least one input configured to receive power from an external power source,
wherein the plurality of switches are disposed between the plurality of passive circuit elements such that, upon changing a state of at least one of the switches, the plurality of passive circuit elements are reconfigured from a first configuration that provides a first filter value for the first output to a second configuration that provides a second filter value for the second output, and wherein the first configuration filters the power according to the first filter value and the second configuration filters the power according to the second filter value.

8. The EMI filter network of claim 7, wherein, when switching from the first configuration to the second configuration, a filter value at the second output changes from a third filter value to the second filter value.

9. The EMI filter network of claim 8, wherein, when switching from the first configuration to the second configuration, a filter value at the first output changes from the first filter value to a fourth filter value.

10. The EMI filter network of claim 7, wherein the plurality of passive circuit elements comprises at least one inductor and at least one capacitor, wherein at least one of the plurality of switches is disposed between the inductor and capacitor to electrically connect and disconnect the capacitor from the inductor.

11. The EMI filter network of claim 7, further comprising:
a controller configured to:
in response to identifying a change in an operational state of a dynamic load comprising the respective loads, control the state of the at least one switch to change the plurality of passive circuit elements from the first configuration to the second configuration.

12. A system, comprising:
an EMI filter network comprising a plurality of switches;
a dynamic load defined by a plurality of loads coupled to the EMI filter network, wherein the dynamic load and the EMI filter network are disposed in an airplane, wherein the dynamic load comprises at least two motors; and
a controller configured to:
configure the EMI filter network to provide a first filter value to the dynamic load, wherein configuring the EMI filter network comprises selecting respective settings of the plurality of switches; and
upon identifying a change in an operational state of the dynamic load, reconfigure the EMI filter network to provide a second filter value to the dynamic load by changing a setting of at least one of the plurality of switches.

13. The system of claim 12, wherein the EMI filter network comprises a plurality of inductors and a plurality of capacitors, wherein the EMI filter network provides the first filter value by electrically connecting the plurality of inductors and capacitors in a first configuration using the plurality of switches and provides the second filter value by electrically connecting the plurality of inductors and capacitors in a second configuration using the plurality of switches.

14. The system of claim 12, wherein the first filter value is provided at a first output of the EMI filter network that connects to a first one of the plurality of loads, and the second filter value is provided at a second output of the EMI filter network that connects to a second one of the plurality of loads.

15. The system of claim 14, wherein, when the EMI filter network provides the first filter value at the first output, the EMI filter network is configured to provide a third filter value at the second output, and wherein the third filter value is different from the second filter value.

16. A system, comprising:
an EMI filter network comprising a plurality of switches;
a dynamic load defined by a plurality of loads coupled to the EMI filter network; and
a controller configured to:
configure the EMI filter network to provide a first filter value to the dynamic load, wherein configuring the EMI filter network comprises selecting respective settings of the plurality of switches; and
upon identifying a change in an operational state of the dynamic load, reconfigure the EMI filter network to provide a second filter value to the dynamic load by changing a setting of at least one of the plurality of switches
wherein the first filter value corresponds to a first operational state of the dynamic load and the second filter value corresponds to a second operational state of the dynamic load, wherein, in the first operational state, a first set of the plurality of loads are operational, and in the second operational state, a second set of the plurality of loads are operational.

17. The system of claim 16, wherein the first set comprises a first load of the plurality of loads that is operational in the first operational state, and wherein the first load is non-operational in the second operational state.

* * * * *